United States Patent [19]
Norman et al.

[11] Patent Number: 5,583,349
[45] Date of Patent: Dec. 10, 1996

[54] FULL COLOR LIGHT EMITTING DIODE DISPLAY

[75] Inventors: Michael P. Norman, Chandler; Paige M. Holm, Phoenix, both of Ariz.

[73] Assignee: Motorola, Schaumburg, Ill.

[21] Appl. No.: 552,154

[22] Filed: Nov. 2, 1995

[51] Int. Cl.$^6$ .................................................. H01L 33/00
[52] U.S. Cl. ................................ 257/88; 257/40; 257/89; 257/90; 257/103
[58] Field of Search ................................ 257/13, 88, 89, 257/90, 91, 92, 94, 96, 103, 40

[56] References Cited

U.S. PATENT DOCUMENTS 5,424,560  6/1995  Norman et al. ............................ 257/89
5,459,337  10/1995  Ito et al. ...................................... 257/89

OTHER PUBLICATIONS

D. R. Baigent et al., "Conjugated Polymer Light–Emitting Diodes On Silicon Substrates", Appl. Phys. Lett. 65 (21), 21 Nov. 1994, pp. 2636–2638.

Primary Examiner—Minhloan Tran
Attorney, Agent, or Firm—Robert F. Hightower

[57] ABSTRACT

A full color light emitting diode display (310) utilizes semiconductor light emitting diodes (313) to produce red light and organic light emitting diodes (312) to produce blue light. Green light is produced by either semiconductor light emitting diodes (313) or by organic light emitting diodes (331). An array of semiconductor light emitting diodes is formed on a semiconductor substrate (322) and an array of organic light emitting diodes is also formed on semiconductor substrate (322) adjacent to the array of semiconductor light emitting diodes. The array of organic light emitting diodes cooperates with the array of semiconductor light emitting diodes to form an array of multi-wavelength pixels of the full color light emitting diode display (310).

15 Claims, 5 Drawing Sheets

FULL COLOR LIGHT EMITTING DIODE DISPLAY

BACKGROUND OF THE INVENTION

The present invention relates, in general, to display devices, and more particularly, to light emitting diode display devices.

In the past, light emitting diodes (LEDs) have been used to create images for visual displays in a variety of applications including communication and visual display devices. In order to provide a full color display, it is important to have LEDs that produce pure red, green, and blue colors that can be combined at different intensities to produce all the required colors of a full color display. Multicolor organic LEDs have even been fabricated on a single substrate in order to create a multicolor image or display. One example of such a multicolor organic LED array is given in U.S. Pat. No. 5,424,560 issued to Norman et al. on Jun. 13, 1995. One problem with prior multicolor organic LED displays is that either the red or green color is not of a appropriate wavelength to produce a full color display. For example, organic LEDs generally produce a red that has a peak at about 610 nanometers instead of the desired 650 nanometers for the color red. Consequently, displays utilizing such LEDs do not produce full color displays.

Additionally, it is very difficult to produce on a single substrate semiconductor LEDs that emit blue light at the desired wavelength along with red and green light at the desired wavelength.

Accordingly, it is desirable to have full color LED displays having LEDs that emit red, blue, and green colors that peak at the wavelengths desired for a full color displays or images.

DETAILED DESCRIPTION OF THE DRAWINGS

Figure 1:
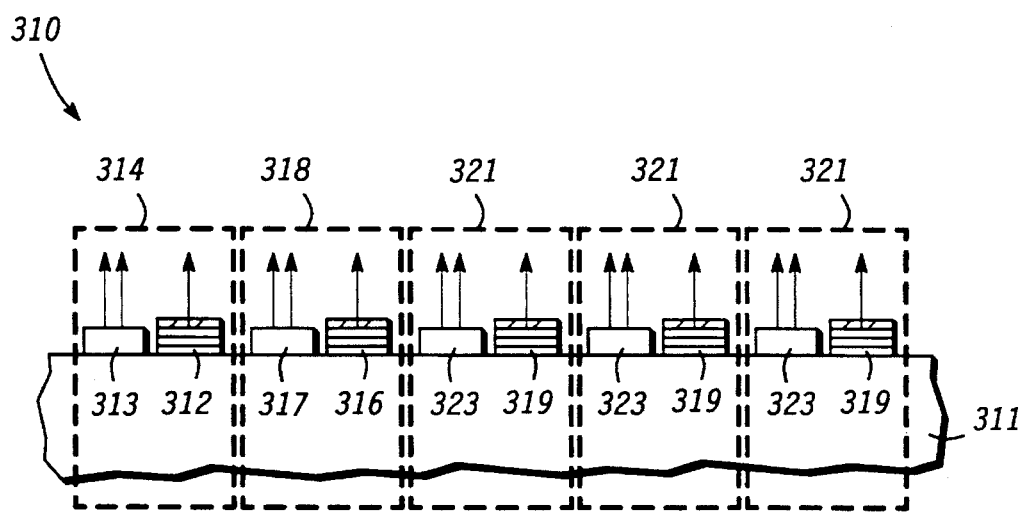
FIG. 1 illustrates an enlarged cross-sectional portion of a full color light emitting diode display in accordance with the present invention.

FIG. 1 illustrates an enlarged cross-sectional portion of a full color light emitting diode display 310 that emits visible red, green, and blue light suitable for making a full color display or image. Display 310 includes a semiconductor substrate 311 on which a plurality of multi-wavelength semiconductor light emitting diodes are formed as an array of semiconductor diodes. The plurality of semiconductor diodes includes diodes 313, 317, and diodes 323. Each of diodes 313, 317 and 323 include first and second light emitting diodes that are stacked together and positioned to emit light in the same direction. The first light emitting diode emits light of a first wavelength and the second light emitting diode emits light of a second wavelength that is different than the first wavelength. These stacked semiconductor light emitting diodes are described in more detail hereinafter beginning with the description of FIG. 3. Diodes 313, 317, and 323 are spaced or centered to a spacing that is suitable for a pixel spacing of the desired image to be provided by display 310. Additionally, an intervening space is provided between each of diodes 313, 317, and 323 to facilitate positioning a plurality of organic light emitting diodes in an array that cooperates with the array of semiconductor light emitting diodes to form an array of pixels that includes multi-wavelength pixels 314, 318, and 321.

The plurality of organic light emitting diodes includes organic light emitting diodes 312, 316, and 319. Each of diodes 312, 316, and 319 emit light at a third wavelength that is different than the first and second wavelengths of light emitted by diodes 313, 317, and 323. Additionally, diodes 312, 316, and 319 emit light in the same direction as diodes 313, 317, and 323. Diodes 312, 316, and 319 typically are referred to as inverted organic light emitting diodes because the transparent conductor is on a top surface and light is emitted through the top surface instead of through the substrate. Each of diodes 312, 316, and 319 is a multi-layer device that typically includes a low work function electron supply conductor formed on substrate 311. A first color organic layer is positioned on the electron supply conductor, and a second color organic layer is positioned on the first color organic layer. The second color organic layer has a defined area for a hole supply conductor, and an optically transparent hole supply conductor on the defined area. For example, the optically transparent hole supply conductor can be indium tin oxide, the first organic layer could use N,N'-diphenyl-N,N'-bis(3-methylphenyl)1-1'biphenyl-4,4'diamine, the second organic layer may be aluminum tris(8-hydroxyquinoline), and the electron supply conductor can be magnesium-silver or lithium-silver or other suitable materials known to those skilled in the art. An example of an inverted organic light emitting diode is discussed in a paper by Baigent et al, "Conjugated polymer light-emitting diodes on silicon substrates", Appl. Phys. Lett. 65 (21), November 1994.

Diodes 312, 316, and 319 are positioned or arranged on centers that facilitate forming pixels of display 310. In the preferred embodiment, diodes 313, 317, and 323 are on twenty micron centers and are approximately ten microns wide. Also in this preferred embodiment, diodes 312, 316, and 319 are also on twenty micron centers and are approximately ten microns wide. Consequently, pixels 314, 318, and 321 are approximately twenty microns wide and are on approximately twenty micron centers. Also in this preferred embodiment diodes 312, 316, and 319 emit blue light that typically has a spectrum that is centered at approximately 470 nanometers with a spectral width of approximately eighty to one hundred fifty nanometers, while diodes 313, 317, and 323 emit red and green light. The red light has a spectrum with a peak at approximately 650 nanometers with a spectral width of approximately twenty nanometers, and the green light has a spectrum with a peak at approximately 570 nanometers with a spectral width of approximately fifteen nanometers.

Figure 2:
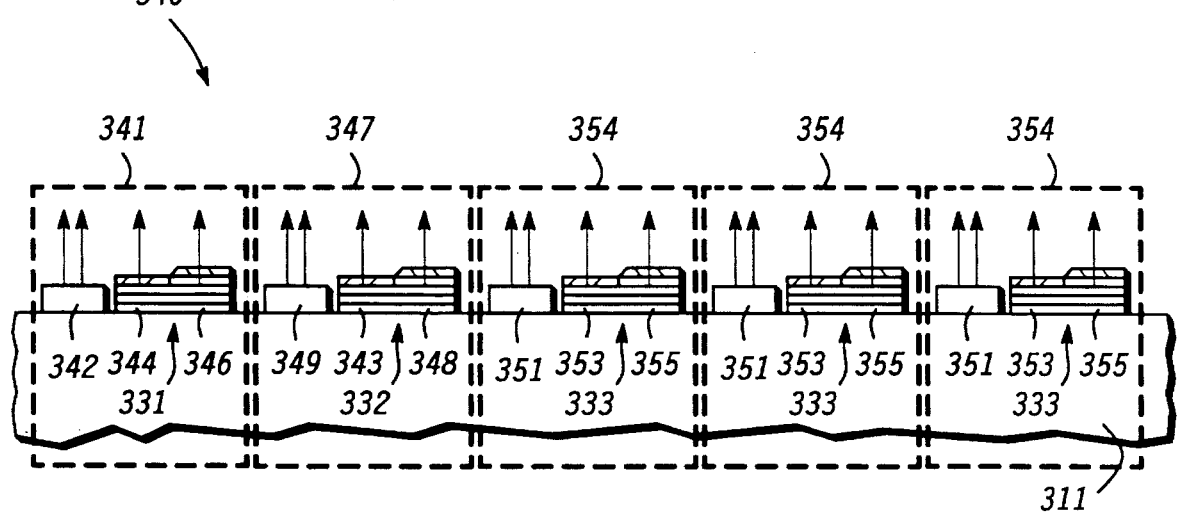
FIG. 2 illustrates an enlarged cross-sectional portion of an alternate embodiment of a full color light emitting diode display in accordance with the present invention.

FIG. 2 illustrates an enlarged cross-sectional portion of a full color light emitting diode display 340 that is an alternate embodiment of display 310 described in FIG. 1. Elements of FIG. 2 that have the same reference numerals as FIG. 1 are the same as the corresponding FIG. 1 elements. Display 340 also emits visible light, and includes semiconductor light emitting diodes 342, 349, and 351 that are formed as an array of semiconductor diodes on semiconductor substrate 311. Diodes 342, 349, and 351 are arranged or centered to facilitate forming an array of pixels of display 340. The array of semiconductor diodes also has an intervening space between diodes 342, 349, and 351 to facilitate forming an array of organic light emitting diodes on substrate 311.

A plurality of multi-wavelength organic light emitting diodes that includes multi-wavelength organic light emitting diodes 331, 332, and 333 is formed as an array of multi-wavelength organic light emitting diodes on semiconductor substrate 311. Diodes 331, 332, and 333 are centered or arranged to cooperate with diodes 342, 349, and 351 respectively, to generate pixels 341, 347, and 354, respectively, of display 340. In the preferred embodiment, diodes 342, 349, and 351 are arranged on twenty micron centers and are approximately five to ten microns wide. Also in this preferred embodiment, diodes 331, 332, and 333 are arranged on twenty micron centers and are approximately ten to fifteen microns wide.

Each of diodes 331, 332, and 333 contain two light emitting areas or two elements that each emit a different color of light. Diode 331 includes a first light emitting element 344 that emits blue light and a second light emitting element 346 that emits green light. Similarly, diode 332 includes elements 343 and 348, while diodes 333 include elements 353 and 355 that emit blue and green light, respectively. Elements 344 and 346 typically are formed by applying an electron supply or electron injecting layer to substrate 311. A low work function conductor typically is used for the electron injecting layer to facilitate supplying electrons. The electron injecting layer generally is common to both elements 344 and 346 and forms the row of the X-Y matrix utilized to activate elements 344 and 346. A first color organic layer or electron transport layer is applied to the electron injecting contact and is common to both elements 344 and 356. A second color organic layer that is a hole transport layer is applied to the electron transport layer and is also common to both elements 344 and 346. The combination of the hole transport and electron transport layers when stimulated produce blue light. A third color organic layer that produces green light is applied to the portion of the first hole transport layer that is element 346. Separate optically transparent hole injecting contacts are applied to elements 344 and 346 so that elements 344 and 346 may be independently stimulated to produce light. The separate hole injecting contacts typically are utilized as the column contact for elements 344 and 346 to form multi-wavelength light emitting diode 331. The electron injecting contact can be any one of a variety of materials such as magnesium-silver, lithium-silver, magnesium-aluminum or lithium-aluminum. The optically transparent hole injecting contact can be either indium tin oxide, very thin layers of platinum, or other similar optically transparent hole injecting materials.

This arrangement allows display 340 to utilize organic light emitting diodes to produce both green and blue colors while using semiconductor light emitting diodes to produce red. The arrangement facilitates generating full color images with display 340.

Figure 3:
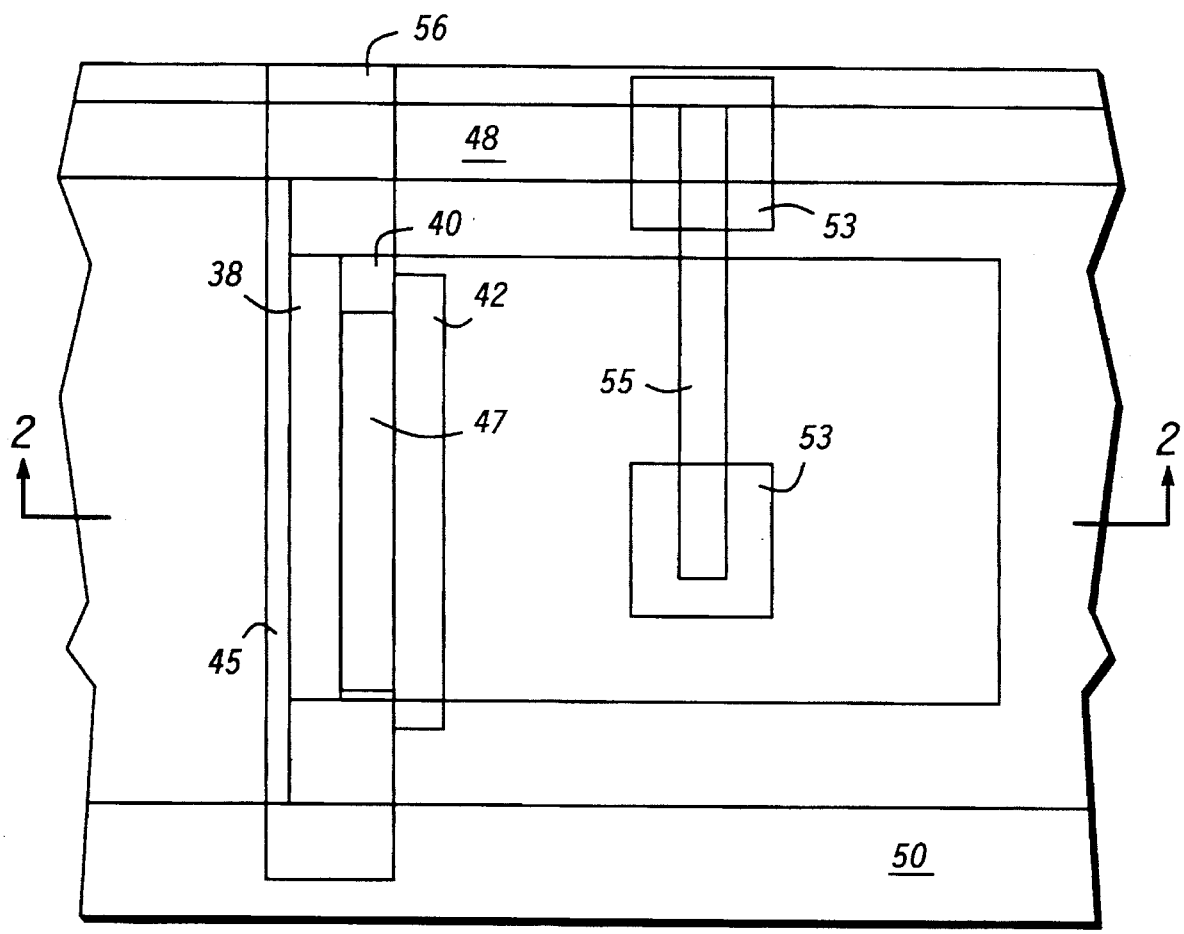
FIG. 3 illustrates an enlarged plan view of a portion of an embodiment of a multi-wavelength semiconductor light emitting diode in accordance with the present invention.
Figure 4:
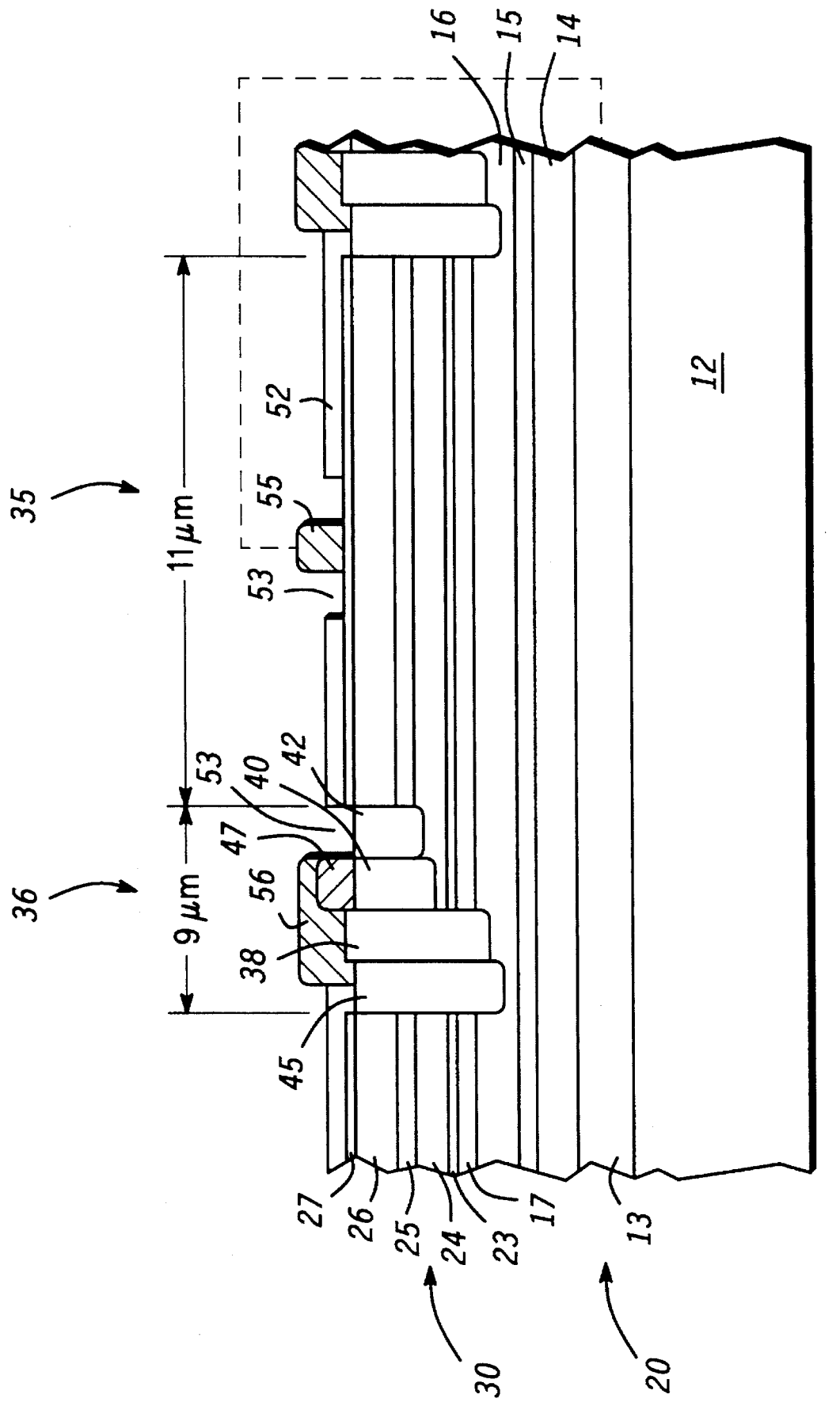
FIG. 4 illustrates an enlarged cross-sectional portion of an embodiment of a multi-wavelength semiconductor light emitting diode in accordance with the present invention.

Referring generally to FIGS. 3 and 4, a top plan and a sectional view, respectively, are illustrated of a multi-wavelength semiconductor light emitting diode or device 10. Device 10 emits light of more than one wavelength similar to diode 313 discussed in FIG. 1. As can be seen best by referring to FIG. 4, device 10 includes a substrate 12 which has a generally planar upper surface. A contact layer 13 of electrically conductive material is positioned on the planar surface of substrate 12. A confinement layer 14 is positioned on the surface of contact layer 13. An active layer 15 is positioned on the surface of confinement layer 14 and another confinement layer 16 is positioned on the surface of active layer 15, thus, layer 15 is sandwiched between two confinement layers. A contact layer 17 of electrically conductive material is positioned on the surface of confinement layer 16 to complete the basic structure for a surface emitting, heterostructure light emitting diode (LED) 20.

A contact layer 23 of electrically conductive material is positioned on the surface of contact layer 17. A confinement layer 24 is positioned on the surface of contact layer 23. An active layer 25 is positioned on the surface of confinement layer 24 and another confinement layer 26 is positioned on the surface of active layer 25. A contact layer 27 of electrically conductive material is positioned on the surface of confinement layer 26 to complete the basic structure for a second surface emitting, heterostructure light emitting diode (LED) 30.

In one embodiment, the various layers are positioned as described above by epitaxially growing the layers sequentially in the order in which they are disposed. In this embodiment, as a specific example, substrate 12 is formed of semi-insulating gallium arsenide (GaAs) and the epitaxially grown layers are in the InGaAlP material system. As a further specific example: contact layer 13 is formed of heavily doped ($>10^{18}$) GaAs with $n^+$ type conductivity; confinement layer 14 is formed of InGaAlP doped for n-type conductivity; active layer 15 is formed of InGaAlP; confinement layer 16 is formed of InGaAlP doped for p-type conductivity; contact layer 17 is formed of heavily doped ($>10^{18}$) GaAs with $p^+$ type conductivity; contact layer 23 is formed of heavily doped ($>10^{18}$) GaAs with $n^+$ type conductivity; confinement layer 24 is formed of InAlP doped for n-type conductivity; active layer 25 is formed of InGaAlP; confinement layer 26 is formed of InAlP (or InGaAlP with 0% Ga) doped for p-type conductivity; and contact layer 27 is formed of heavily doped ($>10^{18}$) GaAs with $p^+$ type conductivity.

In this further specific example, heterostructure LED 30 is constructed to emit at shorter wavelengths, e.g. green light in a 570 nm range, and heterostructure LED 20 is constructed to emit at longer wavelengths, e.g. red light in a 650 nm range. Since LED 30 is constructed to emit shorter wavelength light, active layer 25 and confinement layers 24 and 26 are substantially transparent to light emitted by LED 20. Further, by forming contact layers 17 and 23 of relatively thin, heavily doped material, they are also transparent to light emitted by LED 30. Thus, multi-wavelength device 10 is constructed with a single aperture or light emitting area 35 and light from LED 30 and from LED 20 is emitted through light emitting area 35.

A specific method of fabricating an array of multi-wavelength devices 10 includes the following steps. First, a substrate with a planar surface is provided. Then a plurality of layers of material are sequentially, epitaxially formed, including layers 13–17 and layers 23–27. As a typical example, confinement layers 24 and 26 are formed of InAlP and active layer 25 is formed of InGaAlP with a 50% Al mole fraction for green light emission. It should be understood by those skilled in the art that when referring to a percentage, for example aluminum or gallium, in the present disclosure, the percentage is being expressed in terms of the amount of aluminum relative to the gallium. For example, 50% Al mole fraction would be designated $In(Ga_{1-x}Al_x)P$. Also, 0% Al mole fraction is InGaP and 0% Ga mole fraction is InAlP. Confinement layers 14 and 16 are formed of InGaAlP and active layer 15 is formed of InGaAlP with a 0% Al mole fraction for red light emission. It will of course be understood that other combinations can be devised and that additional LEDs can be incorporated into a single multi-wavelength device, if desired.

Light emitting area 35 and an adjacent contact area 36 are defined by masking and etching contact layer 27, or selectively depositing contact layer 27, for each multi-wavelength device 10. It should be noted that in this specific embodiment light emitting area 35 is approximately an 11 μm square area and adjacent contact area 36 is approximately 9 μm by 11 μm (see FIG. 3). Also, rows and columns of multi-wavelength devices 10 are defined.

Once light emitting area 35 and adjacent contact area 36 for each multi-wavelength device 10 is defined, an impurity 38 is implanted generally in the shape of a vertical column through confinement layer 26, active layer 25, confinement layer 24, contact layer 23 and at least in contact with contact layer 17 in adjacent contact area 36 of each multi-wavelength device 10. In the embodiment illustrated in FIGS. 3 and 4, impurity 38 extends through contact layer 17 and partially into confinement layer 16 to ensure a good electrical contact with contact layer 17. Impurity 38 provides an external, or surface, electrical connection to contact layer 17 (the anode of LED 20) for each multi-wavelength device 10 in the array. In the embodiment being described, since contact layer 17 is the p-type contact for LED 20, impurity 38 is any material that will satisfactorily couple contact layer 17 to the surface for external contact such as, for example, ions of Be.

Another impurity 40 is implanted generally in the shape of a vertical column through confinement layer 26, active layer 25, and at least in contact with confinement layer 24 in adjacent contact area 36 of each multi-wavelength device 10. Care must be taken to ensure that impurity 40 is not implanted through contact layer 17. In the embodiment illustrated in FIGS. 3 and 4, impurity 40 stops just short of contact layer 23. Once impurity 40 is implanted, an anneal step is performed to activate implanted impurities 38 and 40. The anneal step causes the usual spreading and ensures a good electrical contact with contact layer 23, without spreading into layer 17. Impurity 40 provides an external, or surface, electrical connection to contact layer 23 (the cathode of LED 30) for each multi-wavelength device 10 in the array. In the embodiment being described, since contact layer 23 is the n-type contact for LED 30, impurity 40 is any material that will satisfactorily couple contact layer 23 to the surface for external contact such as, for example, ions of Si.

A third impurity 42 is implanted through confinement layer 26, active layer 25 and at least into confinement layer 24, but not through contact layer 23, in adjacent contact area 36 between light emitting area 35 and impurity 40 (actually partially in implant formed by impurity 40) of each multi-wavelength device 10. Impurity 42 forms an isolating resistive volume between light emitting area 35 and conductive impurities 38 and 40 for each multi-wavelength device 10. Thus, impurity 42 isolates LED 30 from the external electrical connections and removes any parasitic p-n junctions that might otherwise form between impurity 40 and the p-type layers of LED 30. In the embodiment being described, impurity 42 is any material that will satisfactorily form an isolating resistive volume for separating or isolating LED 30 from the external contacts such as, for example, ions of H or O.

A fourth impurity 45 is implanted through confinement layer 26, active layer 25, confinement layer 24, contact layers 23 and 17 and at least partially into confinement layer 16 between light emitting area 35 of the adjacent multi-wavelength device 10 and impurity 38 (actually partially in impurity 38) of each multi-wavelength device 10. Impurity 45 forms an isolating resistive volume between adjacent LEDs 20 in the array of LEDs. Thus, impurity 42 isolates LED 20 and provides pixel confinement for LED 20. In the embodiment being described, impurity 45 is any material that will satisfactorily form an isolating resistive volume for separating or isolating LED 20 such as, for example, ions of H or O.

In this embodiment, a step of etching is performed at the row ends to provide an external electrical contact to contact layer 13 (the cathode of LED 20). In this step the ends of the rows are etched to expose a portion of layer 13 for electrical contact therewith.

Contact 47 with impurity 40 (the cathode of LED 30) and row contacts 48 (see FIG. 3) are formed by any of the well known methods. In general, n-type metal is deposited in rows between adjacent multi-wavelength devices 10 to the ends of the rows where, in this embodiment, row contacts 48 are coupled to contact layers 13.

A fifth impurity 50 is deep implanted through all of the epitaxial layers and into substrate 12 adjacent light emitting area 35 to provide row isolation for all multi-wavelength devices 10 positioned in rows. Impurity 50 forms an isolating resistive volume between adjacent rows of multi-wavelength devices 10. In the embodiment being described, impurity 50 is any material that can be deep implanted and will satisfactorily form an isolating resistive volume such as, for example, ions of H, or high energy O+, or equivalents.

A dielectric layer 52 is then formed or deposited over the upper surface of the entire structure and vias 53 are etched therethrough for p-type contacts and access to the n-type metal. Finally, p-type metallization is deposited using any well known method. The p-type metallization is used to form both p-type contacts 55 to contact layer 27 in light emitting area 35 of each multi-wavelength device 10 and column contacts 56. In this specific embodiment, column contacts 56 are in contact with n-type contact 47 and implanted impurity 38 for each multi-wavelength device 10 in each column. Thus, the cathode of LED 30 is connected to the anode of LED 20 by column contact 56. Further, one of vias 53 allows contact 55 to electrically couple to row contacts 48 (see FIG. 3) so that the anode of LED 30 is coupled to the cathode of LED 20.

Figure 5:
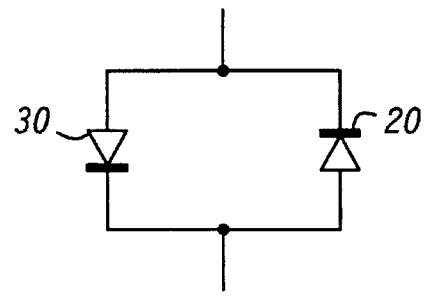
FIG. 5 illustrates an electrical schematic of the diode of FIG. 4 in accordance with the present invention.

The connections described produces a push-pull connection, illustrated schematically in FIG. 5. This push-pull connection of LEDs 20 and 30 of each multi-wavelength device 10 provides individual addressability for all of the LEDs while reducing the surface area required by at least one-half.

Figure 6:
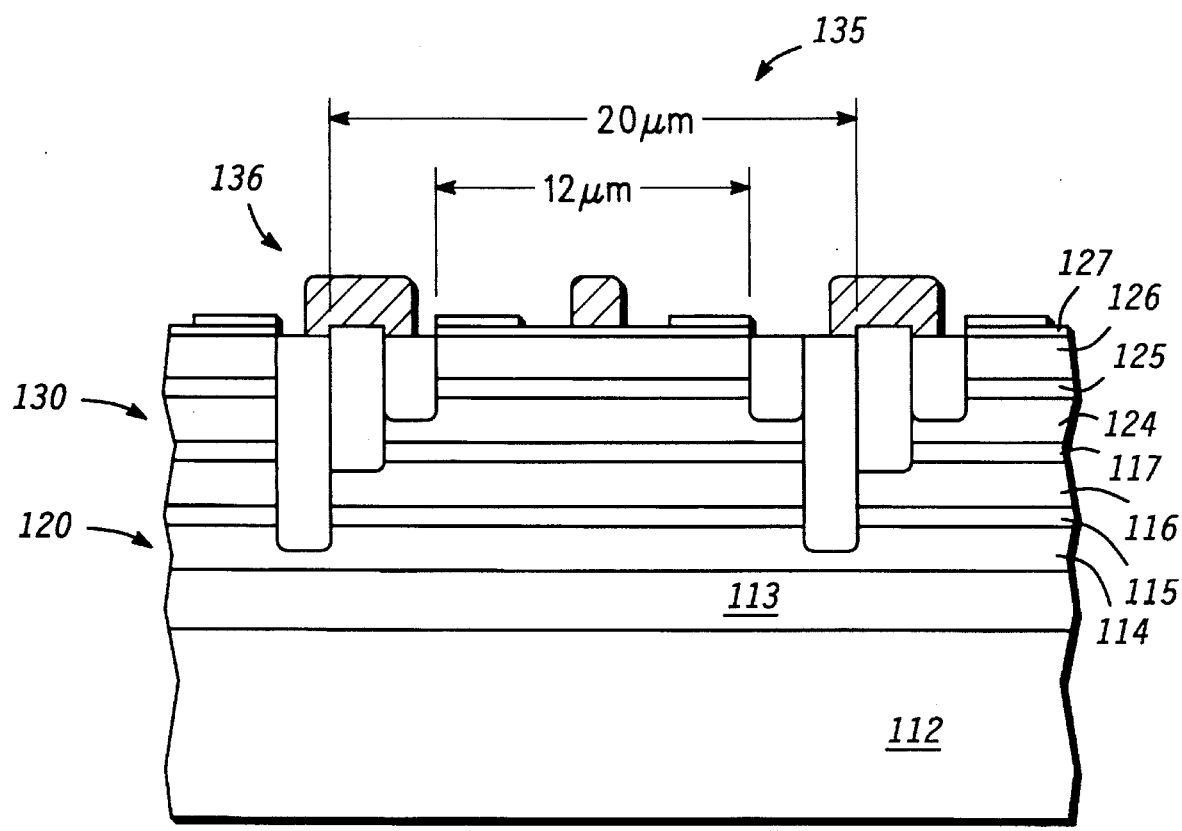
FIG. 6 illustrates an enlarged cross-sectional portion of another embodiment of a multi-wavelength semiconductor light emitting diode in accordance with the present invention.

A different embodiment including a multi-wavelength device 110 is illustrated in a sectional view in FIG. 6. It will of course be understood that device 110 can be formed on a wafer in an array of devices or as a single device. A substrate 112 is provided having a generally planar upper surface. A contact layer 113 of electrically conductive material is positioned on the planar surface of substrate 112. A confinement layer 114 is positioned on the surface of contact layer 113. An active layer 115 is positioned on the surface of confinement layer 114 and another confinement layer 116 is positioned on the surface of active layer 115. A contact layer 117 of electrically conductive material is positioned on the surface of confinement layer 116 to complete the basic structure for a surface emitting, heterostructure LED 120.

In this embodiment, contact layer 117 also serves as a contact layer for a second heterostructure LED 130 positioned on LED 120. A confinement layer 124 is positioned on the surface of contact layer 117. An active layer 125 is positioned on the surface of confinement layer 124 and another confinement layer 126 is positioned on the surface of active layer 125. A contact layer 127 of electrically conductive material is positioned on the surface of confinement layer 126 to complete the basic structure for second surface emitting, heterostructure LED 130.

In this embodiment, as a specific example, substrate 112 is formed of semi-insulating gallium arsenide (GaAs) and the epitaxially grown layers are in the InGaAlP material system. For this specific example: contact layer 113 is formed of heavily doped ($>10^{18}$) GaAs with $n^+$ type conductivity; confinement layer 114 is formed of InGaAlP doped for n-type conductivity; active layer 115 is formed of InGaAlP; confinement layer 116 is formed of InGaAlP doped for p-type conductivity; contact layer 117 is formed of heavily doped ($>10^{18}$) GaAs with $p^+$ type conductivity; confinement layer 124 is formed of InAlP doped for p-type conductivity; active layer 125 is formed of InGaAlP; confinement layer 126 is formed of InAlP doped for n-type conductivity; and contact layer 127 is formed of heavily doped ($>10^{18}$) GaAs with $n^+$ type conductivity.

As in the previous method, a light emitting area 135 and an adjacent contact area 136 are defined by masking and etching contact layer 127, or selectively depositing contact layer 127, for each multi-wavelength device 110. It should be noted that in this specific embodiment light emitting area 135 is approximately a 12 µm square area and by including adjacent contact area 136 the total square area is approximately 20 µm (see FIG. 6). Also, rows and columns of multi-wavelength devices 110 are defined.

Once light emitting area 135 and adjacent contact area 136 for each multi-wavelength device 110 are defined, an impurity 138 is implanted generally in the shape of a vertical column through confinement layer 126, active layer 125, confinement layer 124, and at least in contact with contact layer 117 in adjacent contact area 136 of each multi-wavelength device 110. Impurity 138 provides an external electrical contact for the common anodes (contact layer 117) of LEDs 120 and 130. In the embodiment being described, since contact layer 117 is the p-type contact for both LED 120 and LED 130, implanted impurity 138 can be any material that will satisfactorily couple contact layer 117 to the surface for external contact such as, for example, ions of Be.

Figure 7:
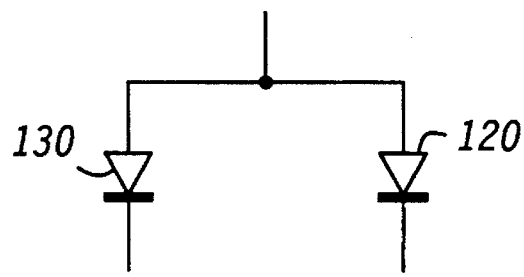
FIG. 7 illustrates an electrical schematic of the diode of FIG. 6 in accordance with the present invention.

The remaining steps of the procedure for fabricating multi-wavelength device 110 of FIG. 6 is basically the same as described in conjunction with multi-wavelength device 10 of FIG. 3. The major difference is that the step of implanting impurity 40 is not required, since the single contact layer (layer 117) is a common connection for the anodes, and as a result, multi-wavelength device 110 is a three terminal device (see schematic diagram of FIG. 7).

One advantage of this specific device and process is that fewer process steps are required. Because multi-wavelength device 110 has a common anode and one cathode for each LED 120 and 130, these devices cannot be driven with the push-pull addressing scheme described above, but are addressed in the usual matrix manner. However, the common anode eliminates half of the I/O requirements along one direction of the array and, thereby, substantially reduces the external connections. Another possible advantage is that both LEDs 120 and 130 can be turned ON at the same time.

Figure 8:
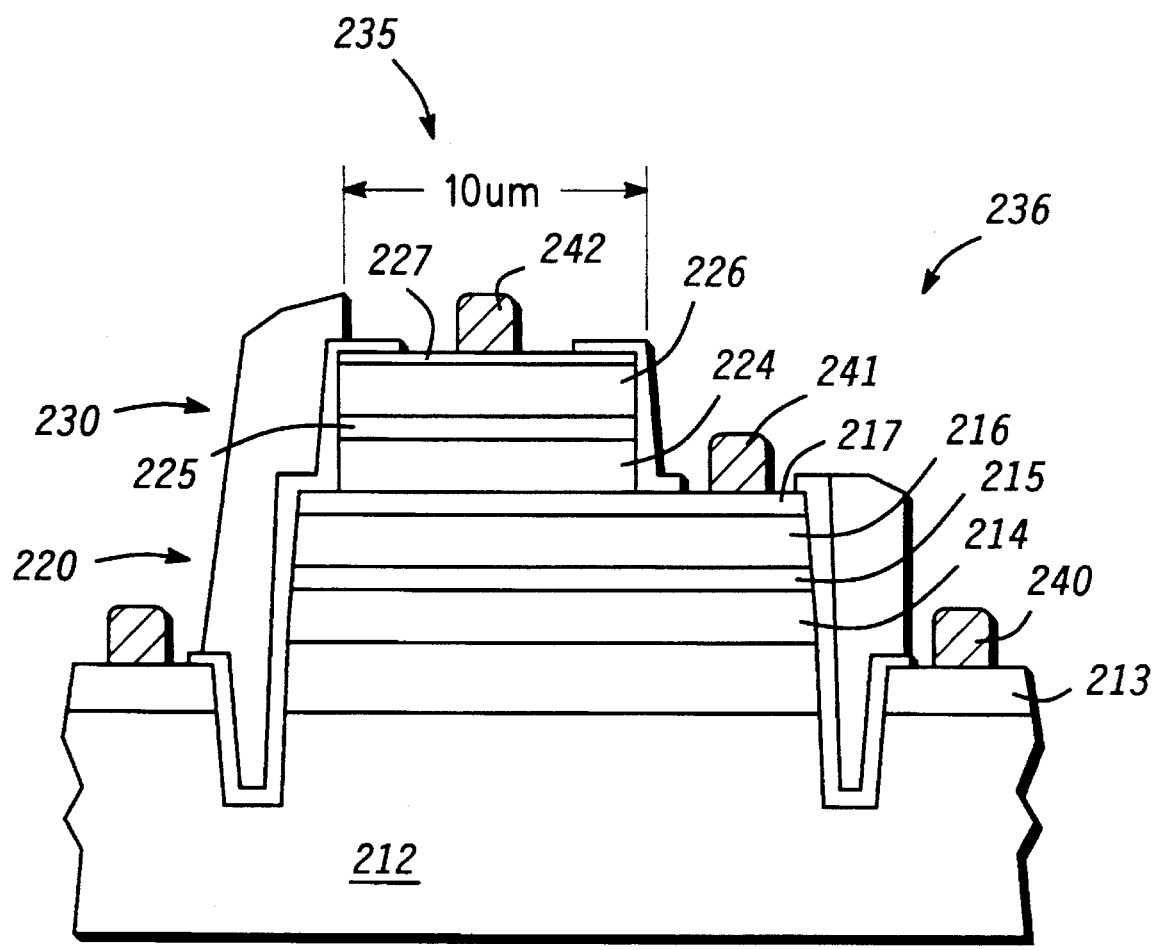
FIG. 8 illustrates an enlarged cross-sectional portion of another embodiment of a multi-wavelength semiconductor light emitting diode in accordance with the present invention.

Referring to FIG. 8, another multi-wavelength light emitting diode device 210, embodying the present invention, is illustrated. Device 210 is constructed by positioning a plurality of layers of material on a substrate as described in conjunction with either of the previous two embodiments. The specific structure for device 210 illustrated has the same structure as described in conjunction with device 110 of FIG. 6. The steps utilized in the fabrication of device 210 are generally as described below.

A substrate 212 of semi-insulating GaAs with a planar surface is provided. A plurality of layers in the InGaAlP material system are epitaxially and sequentially grown on the surface of substrate 212. Layers 213–217 are the same as layers 113–117, described in conjunction with FIG. 6, and form a first LED 220. Layers 224–227 are the same as layers 124–127, described in conjunction with FIG. 6, and form a second LED 230.

A common light emitting area 235 and an adjacent contact area 236 are defined for each device 210 in the array. Mesa etching is performed around light emitting area 235 and adjacent contact area 236 of each multi-wavelength light emitting diode device 210 to separate each multi-wavelength light emitting diode device 210 from each adjacent multi-wavelength light emitting diode device 210. Electrical contacts 240, 241 and 242 are deposited in communication with first contact layer 213, second contact layer 217 and third contact layer 227, respectively, of each multi-wavelength light emitting diode device 210.

In multi-wavelength light emitting diode device 210 the etching defines the devices and provides isolation of LEDs and from adjacent devices. Also, the etching provides access to buried layers for external electrical connections.

Thus, embodiments of multi-wavelength semiconductor light emitting diode device structure, layout, array interconnection and fabrication processes are disclosed. The multi-wavelength semiconductor light emitting diode device disclosed is a single device which emits two or more different peak wavelengths of light from a single aperture. This substantially reduces the amount of wafer real estate that must be utilized for each device and substantially improves the pixel density and fill factor in image generators. Further, the ability to separately excite each LED (or light spectra) is extremely valuable in display applications. Separate intensity control of each LED (or spectra) in the multi-wavelength light emitting diode device allows mixing of the two spectra to provide a wide range of colors on the color chart. Also, the unique structure and fabrication process allow the plurality of LEDs to be electrically interconnected within each full color light emitting diode device so as to implement a novel addressing scheme which minimizes the I/O required to address the array.

By now it should be appreciated that there has been provided a novel full color light emitting diode display. By utilizing both semiconductor and organic light emitting diodes, the display can provide a full range of color images. Forming the organic light emitting diodes on the same substrate as the semiconductor light emitting diodes reduces manufacturing cost and provides accurate placement of individual elements of each pixel. Utilizing a stacked semiconductor LED results in two colors from one single LED thereby minimizing space utilized for the pixel elements. The semiconductor LEDs provide accurate red and green colors while the organic LEDs accurate blue colors. Utilizing two organic LEDs for blue and green provide accurate blue and green colors while utilizing a semiconductor LED for accurate red colors.

We claim:

1. A full color light emitting diode display comprising:

a semiconductor substrate;

a first light emitting diode constructed to emit light of a first wavelength and a second light emitting diode constructed to emit light of a second wavelength, different than the first wavelength, the first and second light emitting diodes being semiconductor light emitting diodes constructed on the semiconductor substrate and stacked together and positioned to both emit light in the same direction wherein one of the first and second light emitting diodes is transparent to light emitted by another of the first and second light emitting diodes; and a third light emitting diode that is an organic light emitting diode formed on the semiconductor substrate and constructed to emit light of a third wavelength wherein the third light emitting diode cooperates with the first and second light emitting diodes to generate a pixel of the display.

2. The full color light emitting diode display of claim 1 wherein one of the first and second light emitting diodes emits light of a shorter wavelength than other of the first and second light emitting diodes.

3. The full color light emitting diode display of claim 2 wherein the light emitted by one of the first and second light emitting diodes is green and light emitted by another of the first and second light emitting diodes is red.

4. The full color light emitting diode display of claim 1 wherein light emitted by the first, second, and third light emitting diodes is visible light.

5. The full color light emitting diode display of claim 1 wherein each of the first and second light emitting diodes includes an active layer of material sandwiched between two confinement layers of material.

6. The full color light emitting diode display of claim 1 wherein light emitted by the first, second, and third light emitting diodes cooperates to form an image of the full color light emitting diode display.

7. A full color light emitting diode display comprising:

a semiconductor substrate;

a first light emitting diode that is a semiconductor light emitting diode formed on the semiconductor substrate and constructed to emit light of a first wavelength; and a second light emitting diode having a first and a second light emitting element, the first light emitting element constructed to emit light of a second wavelength, different from the first wavelength and the second light emitting element constructed to emit light of a third wavelength, different than the first and second wavelengths, the second light emitting diode being an organic light emitting diode constructed on the semiconductor substrate wherein the second light emitting diode emits light in the same direction as the first light emitting diode and cooperate with the first light emitting diode to generate a pixel of the full color light emitting diode display.

8. The full color light emitting diode display of claim 7 wherein the light emitted by one of the first and second light emitting elements is green and the light emitted by another of the first and second light emitting elements is blue.

9. The full color light emitting diode display of claim 7 wherein each of the first and second light emitting elements includes a low work function conductor that is an electron supply layer formed on the semiconductor substrate, a first color organic layer positioned on the electron supply layer, a second color organic layer on the first color organic layer wherein the second color organic layer has a defined area for a hole supply conductor, the second light emitting element having a third color organic layer on a portion of the second color organic layer wherein the third color organic layer has defined area for a hole supply conductor, and the first and second light emitting elements having an optically transparent hole supply conductor on the defined area.

10. A full color light emitting diode display comprising:

a semiconductor substrate having an array of semiconductor light emitting diodes; and an array of organic light emitting diodes on the semiconductor substrate wherein the array of organic light emitting diodes cooperates with the array of semiconductor light emitting diodes, one semiconductor light emitting diode associated with each organic light emitting diode to define a pixel, to form an array of pixels of the full color light emitting diode display.

11. The full color light emitting diode display of claim 10 wherein each semiconductor light emitting diode of the array of semiconductor light emitting diodes includes a multi-wavelength semiconductor light emitting diode that emits a first wavelength of light and a second wavelength of light that is different than the first wavelength of light.

12. The full color light emitting diode display of claim 11 wherein each organic light emitting diode of the array of organic light emitting diodes emits a third wavelength of light that is different than the first and second wavelengths of light.

13. The full color light emitting diode display of claim 10 wherein each semiconductor light emitting diode of the array of semiconductor light emitting diodes emits a first wavelength of light that is in a visible spectrum of light.

14. The full color light emitting diode display of claim 13 wherein each organic light emitting diode of the array of organic light emitting diodes includes two light emitting elements wherein a first light emitting element emits a second wavelength of light that is different than the first wavelength of light, and a second light emitting element emits a third wavelength of light that is different than the first and second wavelengths of light.

15. The full color light emitting diode display of claim 14 wherein each of the first and second light emitting elements includes a low work function conductor that is an electron supply layer formed on the semiconductor substrate, a first color organic layer positioned on the electron supply layer, a second color organic layer on the first color organic layer wherein the second color organic layer has a defined area for a hole supply conductor, the second light emitting element having a third color organic layer on a portion of the second color organic layer wherein the third color organic layer has defined area for a hole supply conductor, and the first and second light emitting elements having an optically transparent hole supply conductor on the defined area.

* * * * *